US011335815B1

(12) United States Patent
Yang et al.

(10) Patent No.: US 11,335,815 B1
(45) Date of Patent: May 17, 2022

(54) METHOD OF MAKING WIDE TUNING RANGE AND SUPER LOW CAPACITANCE VARACTOR DIODES

(71) Applicant: Global Communication Semiconductors, LLC, Torrance, CA (US)

(72) Inventors: Yuefei Yang, Torrance, CA (US); Shing-Kuo Wang, Torrance, CA (US); Wing Yau, Torrance, CA (US)

(73) Assignee: Global Communication Semiconductors, LLC, Torrance, CA (US)

( * ) Notice: Subject to any disclaimer, the term of this patent is extended or adjusted under 35 U.S.C. 154(b) by 0 days.

(21) Appl. No.: 17/180,743

(22) Filed: Feb. 20, 2021

(51) Int. Cl.
| | |
|---|---|
| *H01L 29/93* | (2006.01) |
| *H01L 29/417* | (2006.01) |
| *H01L 29/66* | (2006.01) |
| *H01L 23/31* | (2006.01) |
| *H01L 23/485* | (2006.01) |

(Continued)

(52) U.S. Cl.
CPC .......... *H01L 29/93* (2013.01); *H01L 23/3171* (2013.01); *H01L 23/3192* (2013.01); *H01L 23/485* (2013.01); *H01L 23/4821* (2013.01); *H01L 29/417* (2013.01); *H01L 29/66174* (2013.01); *H01L 29/66196* (2013.01); *H01L 29/20* (2013.01)

(58) Field of Classification Search
CPC ............. H01L 23/3171; H01L 23/3192; H01L 23/4821; H01L 23/485; H01L 29/417; H01L 29/66174; H01L 29/66196; H01L 29/20
See application file for complete search history.

(56) References Cited

U.S. PATENT DOCUMENTS

| | | | | |
|---|---|---|---|---|
| 8,716,757 B1 * | 5/2014 | Yang | ................... | H01L 29/0821 |
| | | | | 438/285 |
| 10,896,981 B1 * | 1/2021 | Tao | ...................... | H01L 21/8252 |
| 2019/0386154 A1 * | 12/2019 | Tao | ................... | H01L 29/66189 |

* cited by examiner

*Primary Examiner* — Jose R Diaz
(74) *Attorney, Agent, or Firm* — Christopher P. Maiorana, PC (57) ABSTRACT

A semiconductor device includes a semiconductor die, an N-doped region, an N-contact metal, a PN junction mesa, a P-contact metal, a first passivation layer, an anode feed metal, and a cathode feed metal. The semiconductor die may include a plurality of semiconductor layers disposed on an insulating substrate. The N-doped region may define an active area of the device. The N-contact metal may be disposed on a first portion of the N-doped region. The PN junction mesa may be disposed on a second portion of the N-doped region. The PN junction mesa may comprise a hyperabrupt N-doping layer disposed on the first portion of the N-doped region and a P-doped layer disposed on the hyperabrupt N-doping layer. The P-contact metal may be disposed on the P-doped layer of the PN junction mesa. The first passivation layer may cover the semiconductor layers of the semiconductor device and have openings for the N-contact metal and the P-contact metal. The anode feed metal may connect the P-contact metal to a first bond pad. The anode feed metal generally forms an arch from the P-contact metal to the first bond pad and the arch defines a space between the anode feed metal and the first passivation layer covering the semiconductor layers and a the of the PN junction mesa.

20 Claims, 5 Drawing Sheets

(51) Int. Cl.
*H01L 23/482* (2006.01)
*H01L 29/20* (2006.01)

METHOD OF MAKING WIDE TUNING RANGE AND SUPER LOW CAPACITANCE VARACTOR DIODES

FIELD OF THE INVENTION

The invention relates to semiconductor devices for use in radio frequency applications generally and, more particularly, to a method and/or apparatus for making wide tuning range and super low capacitance varactor diodes.

BACKGROUND

Typical old technology uses large device size to obtain relatively low parasitic capacitance. Currently, most varactor diode products have high capacitance values, with the lowest typical value in the 100 femtoFarad (fF) range. Only one existing varactor diode product shows a low capacitance value in the 20 fF range. However, a tuning range of the varactor diode product is below 7:1. Existing varactor diode technology has either high minimum capacitance (Cmin) or low (narrow) tuning range.

It would be desirable to implement a method of making wide tuning range and super low capacitance varactor diodes.

SUMMARY

The invention concerns a semiconductor device comprising a semiconductor die, an N-doped region, an N-contact metal, a PN junction mesa, a P-contact metal, a first passivation layer, an anode feed metal, and a cathode feed metal. The semiconductor die may include a plurality of semiconductor layers disposed on an insulating substrate. The N-doped region may define an active area of the device. The N-contact metal may be disposed on a first portion of the N-doped region. The PN junction mesa may be disposed on a second portion of the N-doped region. The PN junction mesa may comprise a hyperabrupt N-doping layer disposed on the first portion of the N-doped region and a P-doped layer disposed on the hyperabrupt N-doping layer. The P-contact metal may be disposed on the P-doped layer of the PN junction mesa. The first passivation layer may cover the semiconductor layers of the semiconductor device and have openings for the N-contact metal and the P-contact metal. The anode feed metal may connect the P-contact metal to a first bond pad. The anode feed metal generally forms an arch from the P-contact metal to the first bond pad and the arch defines a space between the anode feed metal and the first passivation layer covering the semiconductor layers and a the of the PN junction mesa.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing a method of making wide tuning range and super low capacitance varactor diodes that may (i) provide a tuning range greater than 8:1, (ii) provide a minimum capacitance (Cmin) value below 36 femtofarads (fF), (iii) provide a device size less than 20 micrometers in diameter for millimeter wave (mmWave) applications, (iv) utilize an epitaxial structure, (v) use an air bridge to connect anode contacts to reduce parasitic capacitance, (vi) use an organic low dielectric material, such as benzocyclobutene (BCB) or polyimide (PI) to under-fill the air bridge for passivation while still maintaining low parasitics, (vii) be used in a mmWave antenna for Fifth Generation (5G) deployment, and/or (vi) be implemented as one or more monolithic microwave integrated circuits (MMICs).

In various embodiments, a wider tuning range varactor epitaxial structure is provided, which uses a small device size (e.g., <20 μm in diameter or <300 μm² in area) to achieve low Cmin and an air bridge to connect anode contacts to reduce parasitic capacitances. An optional process uses a low dielectric material, such as benzocyclobutene (BCB) or polyimide (PI) to under-fill the air bridge for passivation, which still maintains low parasitic capacitances. In various embodiments, varactor diodes may be formed having an advantage that Cmin may be as low as 30 fF with a tuning range greater than 8:1, which cannot be achieved by previous technology. The varactor diode device in accordance with an embodiment of the invention may be used in a mmWave antenna application for future 5G deployment.

Figure 1:
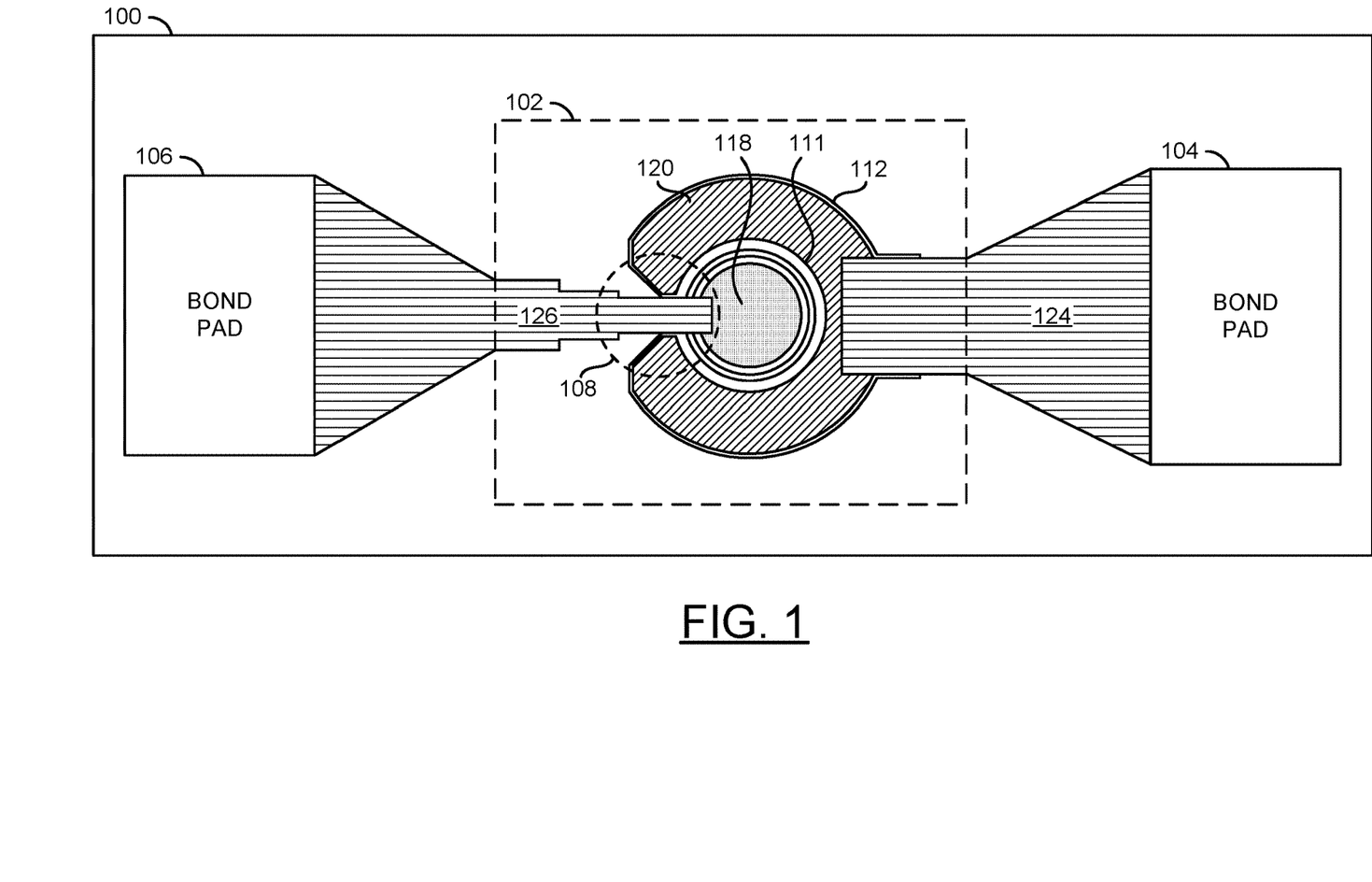
FIG. 1 is a diagram illustrating a plan view of a semiconductor device in accordance with an example embodiment of the invention.

Referring to FIG. 1, a diagram is shown illustrating a plan view of a semiconductor device in accordance with an example embodiment of the invention. In various embodiments, a semiconductor device 100 may comprise a varactor diode 102, a first bond pad 104 and a second bond pad 106. In various embodiments, a section (highlighted by a dashed circle 108) of a portion of an active area of the varactor diode 102 and an annular N-contact metal disposed thereon may be removed to minimize an overlap between an anode feed line metal structure and the portion of the active area and the annular N-contact metal disposed thereon surrounding a PN-junction mesa of the varactor diode 102. Minimizing the overlap generally reduces or eliminates parasitic capacitances.

In various embodiments, the varactor diode 102, the first bond pad 104, and the second bond pad 106 may be formed on a substrate 110. In an example, the substrate 110 may comprise a portion of wafer having a thickness of about 4 mils. In an example, the wafer may comprise semi-insulating Gallium Arsenide (GaAs) material. The varactor diode 102 may be formed by a plurality of epitaxial layers applied to the substrate 110. In an example, the varactor diode 102 may comprise a PN-junction mesa 111 formed on a first semiconductor layer 112. The PN-junction mesa 111 may be topped by a P-contact metal 118. An annular N-contact metal 120 may be formed on a portion of the first semiconductor layer 112 surrounding the PN-junction mesa 111. A cathode feed line metal structure 124 may be formed to electrically connect the annular N-contact metal 120 to the bond pad 104. An anode feed line metal structure 126 may be formed to electrically connect the P-contact metal 118 to the bond pad 106.

In various embodiments, the PN-junction mesa 111 may have a diameter of smaller than about 20 μm. In some embodiments, the PN-junction mesa 111 may be formed having an area smaller than about 300 μm². In various embodiments, the section (e.g., a wedge) of the portion of the first semiconductor layer 112 surrounding the PN-junction mesa 111 and the annular N-contact metal 120 disposed thereon (highlighted by the dashed circle 108) may be removed to minimize an overlap between the anode feed line metal structure 126 and the portion of the first semiconductor layer 112 surrounding the PN-junction mesa 111 and the annular N-contact metal 120 disposed thereon. Minimizing the overlap generally reduces or eliminates parasitic capacitances.

Figure 2:
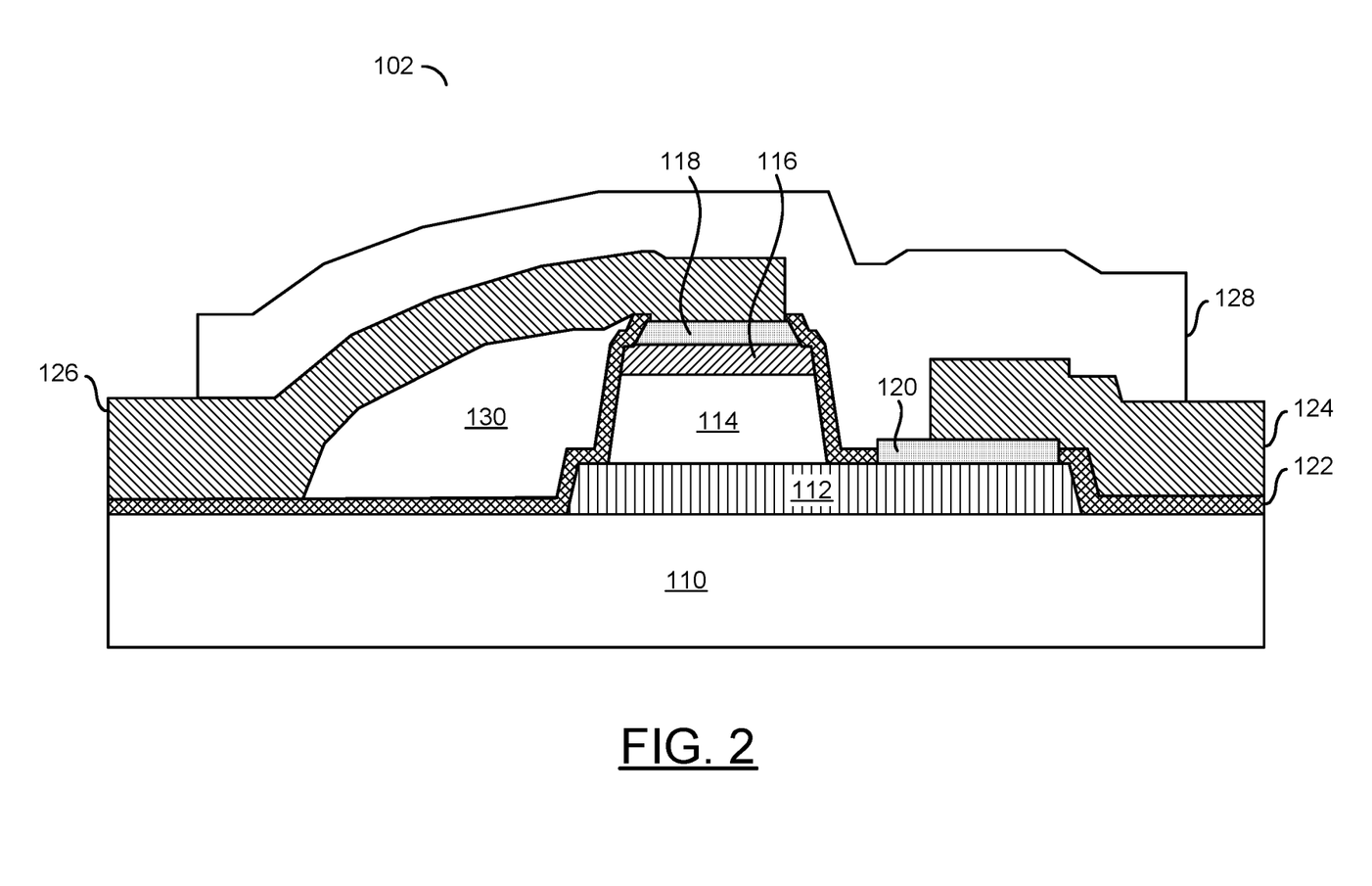
FIG. 2 is a schematic diagram showing a sectional view of a semiconductor device in accordance with an example embodiment of the invention.

Referring to FIG. 2, a diagram showing a sectional view is shown illustrating the semiconductor device 102 in accordance with an example embodiment of the invention. On the substrate layer 110, a highly doped n-type semiconductor layer 112, an n-type hyper abrupt doping profile GaAs layer 114, and a highly doped p-type semiconductor (e.g., p+ GaAs) layer 116 are sequentially formed using a desired process, such as metal organic chemical vapor deposition (MOCVD), molecular beam epitaxy (MBE), hydride vapor phase epitaxy (HYPE) or a combination thereof. In an example, the layer 112 may comprise Si doped n+ GaAs with a doping concentration greater than $3 \times 10^{18}$ cm$^{-3}$. In an example, the layer 114 may comprise a doping profile ranging from a low doping concentration (e.g., $1 \times 10^{15}$ cm$^{-3}$ at the boundary with the layer 112 to a medium doping concentration (e.g., $1 \times 10^{17}$ cm$^{-3}$) at the boundary with the layer 116. In an example, the layer 116 may comprise c-doped GaAs with a doping concentration greater than $2 \times 10^{19}$ cm$^{-3}$. On the layer 116, a P-contact metal 118 is formed. In the semiconductor layers 114 and 116, the PN-junction mesa 111 is formed. In the semiconductor layer 112, an active island or a mesa section may be formed, each of which generally provides device-to-device isolation.

On the active island or mesa section of the layer 112 surrounding the PN-junction mesa 111, an annular N-contact metal 120 is deposited. Over the semiconductor substrate 110, the semiconductor layer 112, the annular N-contact metal 120, and the PN-junction mesa 111, a conformal passivation layer 122 may be formed with an inorganic dielectric material (e.g., silicon nitride (Si3N4)). The passivation layer 122 may be formed with openings for making electrical connections to a cathode feed electrode 124 and an anode feed electrode 126 for the semiconductor device 102. In particular, the cathode feed electrode 124 makes contact with the annular N-contact metal 120 through a first opening in the passivation layer 122 and the anode feed electrode 126 makes contact with the P-contact metal 118 through a second opening in the passivation layer 122. The cathode feed electrode 124 and the anode feed electrode 126 electrically couple the annular N-contact metal 120 and the P-contact metal 118, respectively, to the respective bond pads 104 and 106, or to various other devices or elements (not shown).

The anode feed electrode 126 is generally configured as an air bridge, which defines a space 130 separating the anode feed electrode 126 from a portion of the passivation layer 122 covering the semiconductor layer 112 and the PN-junction mesa 111. In various embodiments, the space 130 may be back-filled with an inorganic low dielectric material, polyimide (PI), benzocyclobutene (BCB), or air. One or more conformal passivation layers 128 are formed over the semiconductor device 102.

In various implementations, the semiconductor layer 114 generally has a non-uniform doping profile in order to control the (reverse biased) voltage versus capacitance characteristics of the varactor diode 102. In some embodiments, the non-uniform profile is a hyper-abrupt profile given by the following Equation 1:

$$N = Bx^m, \qquad \text{EQ. 1}$$

where B and m are constants, and x is a measure of the distance from the surface of the tuning layer proximal to the semiconductor layer 116. In some implementations (e.g., a reverse biased pn-junction with a hyper-abrupt doping profile), varactor diode 102 has a capacitance as a function of reverse bias approximated by the following Equation 2:

$$C(V_R) = \left\{ \frac{eB\varepsilon_S^{m+1}}{(m+2)(V_{bi} + V_R)} \right\}^{\frac{1}{m+2}}, \qquad \text{EQ. 2}$$

where C is the capacitance of varactor diode 102, $V_R$ is the applied reverse bias voltage, e is the fundamental electron charge, $\varepsilon_s$ is the permittivity of the second semiconductor material and $V_{bi}$ is a built-in voltage of the pn-junction that is well-known in the art. Various capacitance versus reverse bias relationships can thus be realized by adjusting m. In some implementations, varactor diode 102 is placed in parallel with an inductor with inductance L. The resonance frequency of the LC-circuit created using varactor diode 102 may be expressed by the following Equation 3:

$$f_r = \frac{1}{2\pi\sqrt{LC}}. \qquad \text{EQ. 3}$$

In some implementations, it is desirable to fabricate an LC-circuit with a resonance frequency that varies linearly as a function of $V_R$. In the example above, this is realized with m=−3/2. In some embodiments, however, m takes on different values (e.g., between −0.5 and −1.9).

In some embodiments, the non-uniform doping profile is non-uniform in other directions in addition to being non-uniform as a function of distance from the surface of the tuning layer proximal to the semiconductor layer 116. In some embodiments, the non-uniform doping distribution is considered hyper-abrupt if the difference between an ideal hyper-abrupt profile (e.g., given by Equation 2 above) is less than a threshold everywhere within the semiconductor layer 114. In some embodiments, the non-uniform doping profile is considered hyper-abrupt if an average difference (e.g., a root mean square, or "RMS" difference) is less than a threshold. In some embodiments, RMS difference is given by the following Equation 4:

$$\varepsilon_{RMS} = \sqrt{\frac{\int_V (N_I(r) - N_R(r))^2 d^3r}{\int_V d^3r}}, \qquad \text{EQ. 4}$$

where $N_I$ is the ideal doping distribution, $N_R$ is the realized hyper-abrupt doping distribution, V is the volume of the tuning layer, and r is a spatial vector.

Figure 3:
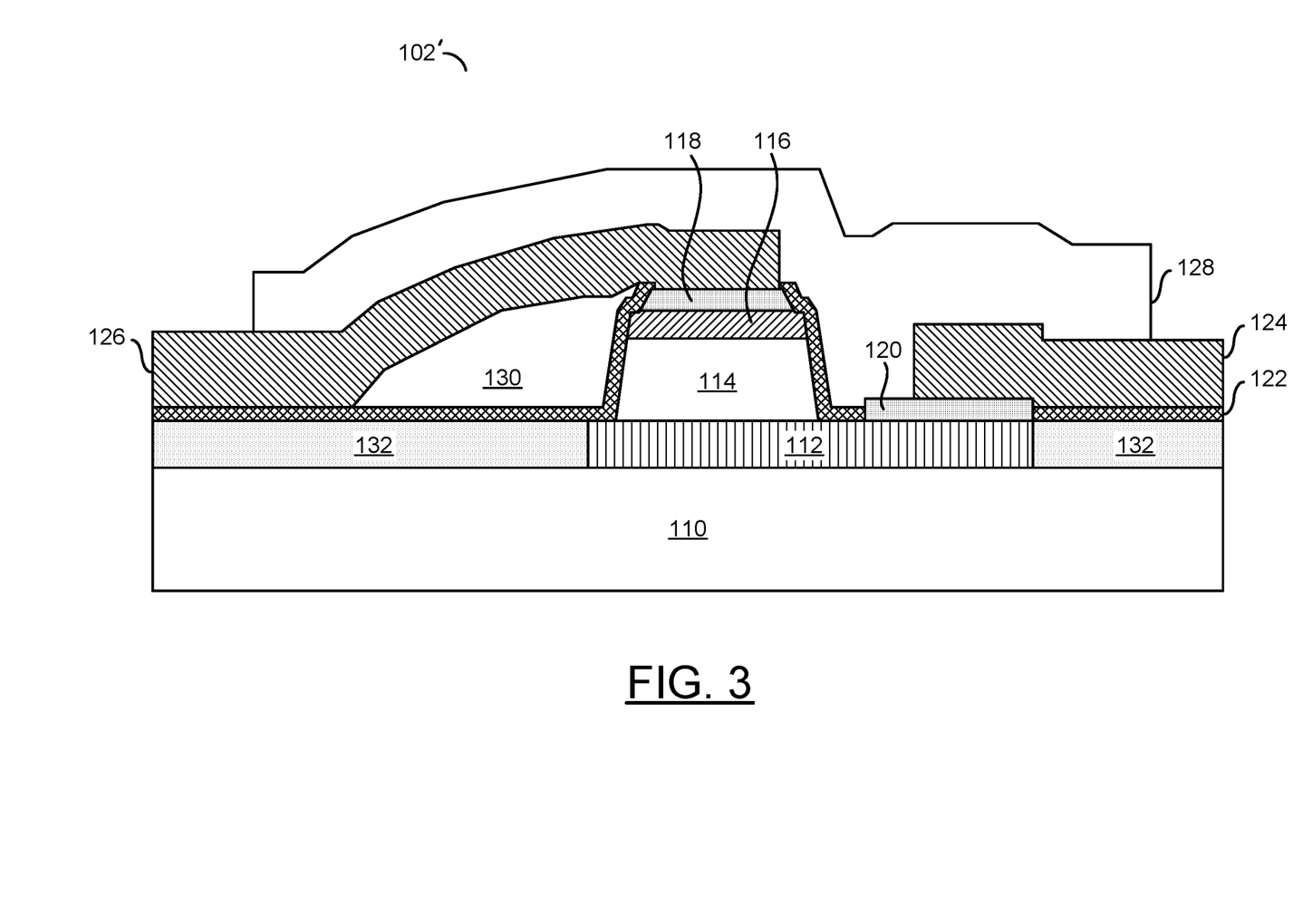
FIG. 3 is a schematic diagram showing a sectional view of a semiconductor device in accordance with another example embodiment of the invention.

Referring to FIG. 3, a diagram showing a sectional view is shown illustrating a semiconductor device 102' in accordance with another example embodiment of the invention. The semiconductor device 102' is generally implemented similarly to the semiconductor device 102. However, instead of an active island or mesa section being formed by removing portions of the layer 112, portions 132 of the semiconductor layer 112 outside the active island or mesa section are turned into semi-insulating material (e.g., using ion implantation), which provides device-to-device isolation.

Figure 4:
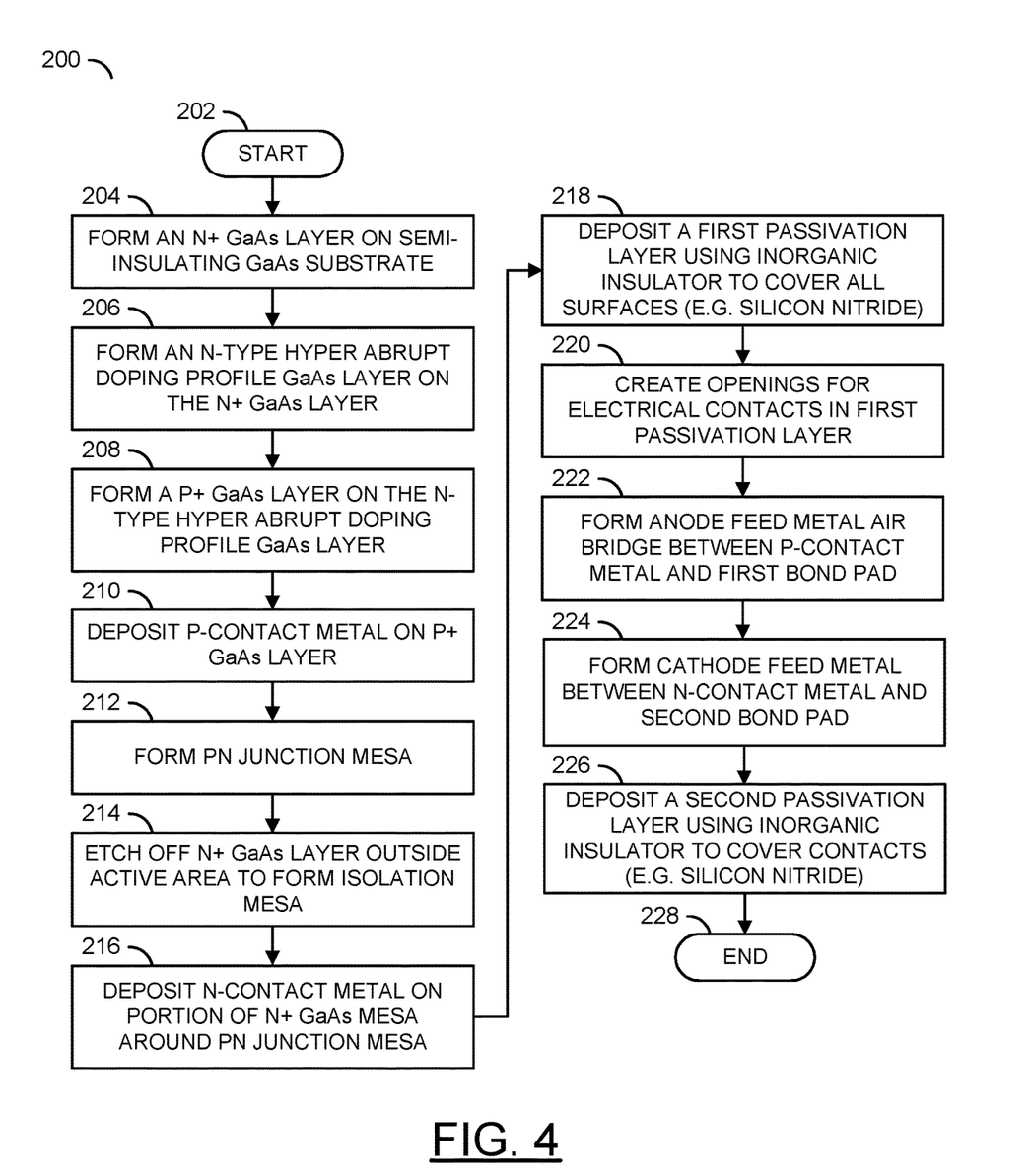
FIG. 4 is a flow diagram of a method for fabricating a semiconductor device in accordance with an example embodiment of the invention.

Referring to FIG. 4, a flow diagram of a process 200 is shown illustrating a method of fabricating a semiconductor device. In an example embodiment, the process (or method) 200 may comprise a step (or state) 202, a step (or state) 204, a step (or state) 206, a step (or state) 208, a step (or state) 210, a step (or state) 212, a step (or state) 214, a step (or state) 216, a step (or state) 218, a step (or state) 220, a step (or state) 222, a step (or state) 224, a step (or state) 226, and a step (or state) 228. The process 200 generally begins at the step 202 and moves to the step 204. In the step 204, the process 200 begins with the formation of a first layer of N+ GaAs on a semi-insulating GaAs substrate. The first layer may be formed by epitaxial growth or other suitable techniques. In the step 206, the process 200 may continue with formation of a second layer of N-type GaAs on the first layer of N+ GaAs. The second layer may be formed by epitaxial growth or other suitable techniques. The formation of the second layer may include creating a hyperabrupt doping profile within the second layer. In an example, the doping level may increase from a minimum value (e.g., $1 \times 10^{15}$ cm$^{-3}$) at the interface between the first layer and the second layer to a maximum level (e.g., $1 \times 10^{17}$ cm$^{-3}$) at an interface between the second layer and a third layer.

In the step 208, the process 200 may continue with the formation of the third layer of P+ GaAs on the second layer. The third layer may be formed by epitaxial growth or other suitable techniques. The thickness of the third layer may be substantially less than the thickness of the second layer. In an example embodiment, the first layer (e.g., N+ GaAs layer 112) may have a thickness range from about 500 nm to about 2000 nm, the second layer (e.g., n-type hyper abrupt doping profile layer 114) may have a thickness range from about 1000 nm to about 3000 nm, and the third layer (e.g., P+ GaAs layer 116) may have a thickness range from about 60 nm to about 200 nm. In the step 210, the process 200 may proceed with formation of a P-contact metal on the third layer of P+ GaAs. Formation of the P-contact metal on the third layer of P+ GaAs may include performing a metallization process to form the contact metal. In some embodiments, this may include forming one or more layers of metal by evaporation or other suitable techniques.

In the step 212, the process 200 may continue with the formation of a PN junction mesa. In the step 214, the process 200 continues with the formation of an isolation mesa defining an active area of the semiconductor device. In an example, the N+ GaAs first layer may be etched off outside the active area forming the isolation mesa. When the isolation mesa has been formed, the process 200 may move to the step 216. In the step 216, the process 200 may proceed with formation of an annular N-contact metal on a portion of the first layer of N+ GaAs surrounding the PN junction mesa. Formation of the annular N-contact metal on the first layer of N+ GaAs may include performing a metallization process to form the contact metal. In some embodiments, this may include forming one or more layers of metal by evaporation or other suitable techniques.

In the step 218, the process 200 continues by depositing a first passivation layer to cover all the surfaces of the semiconductor device. In an example, the first passivation layer may comprise an inorganic insulator (e.g., Silicon Nitride, etc.). In an example, the first passivation layer may comprise a thickness ranging from about 200 nm to about 500 nm. In the step 220, the process 200 continues by forming openings in the first passivation layer to expose the P-contact metal and the N-contact metal. In the step 222, the process 200 may continues with formation of an anode feed metal air bridge between the P-contact metal and a first bond pad. The air bridge helps to reduce parasitic capacitance. In some embodiments, the step 222 of the process 200 may include back filling a space under the anode feed metal air bridge with a low dielectric material, polyimide, or BCB. In the step 224, the process may continue with formation a cathode feed metal between the N-contact metal and a second bond pad. In an example, the anode feed metal and the cathode feed metal may comprise Gold with a thickness of about 3 µm. In some embodiments, the anode feed line metal and the cathode feed line metal may be formed in a single step.

When the anode feed line metal and the cathode feed line metal have been formed, the process 200 may move to the step 226. In the step 226, the process 200 may deposit a second passivation layer to cover all the contacts and feed line metal. In an example, the second passivation layer may comprise an inorganic insulator (e.g., silicon nitride, etc.), polyimide, or BCB. In an example, a thickness of the second passivation layer may vary from about 3 µm to about 5 µm. In the step 228, the process 200 may be terminated with the semiconductor device in wafer form. At a later time, the process 200 may continue with wafer thinning and die singularization steps.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 5:
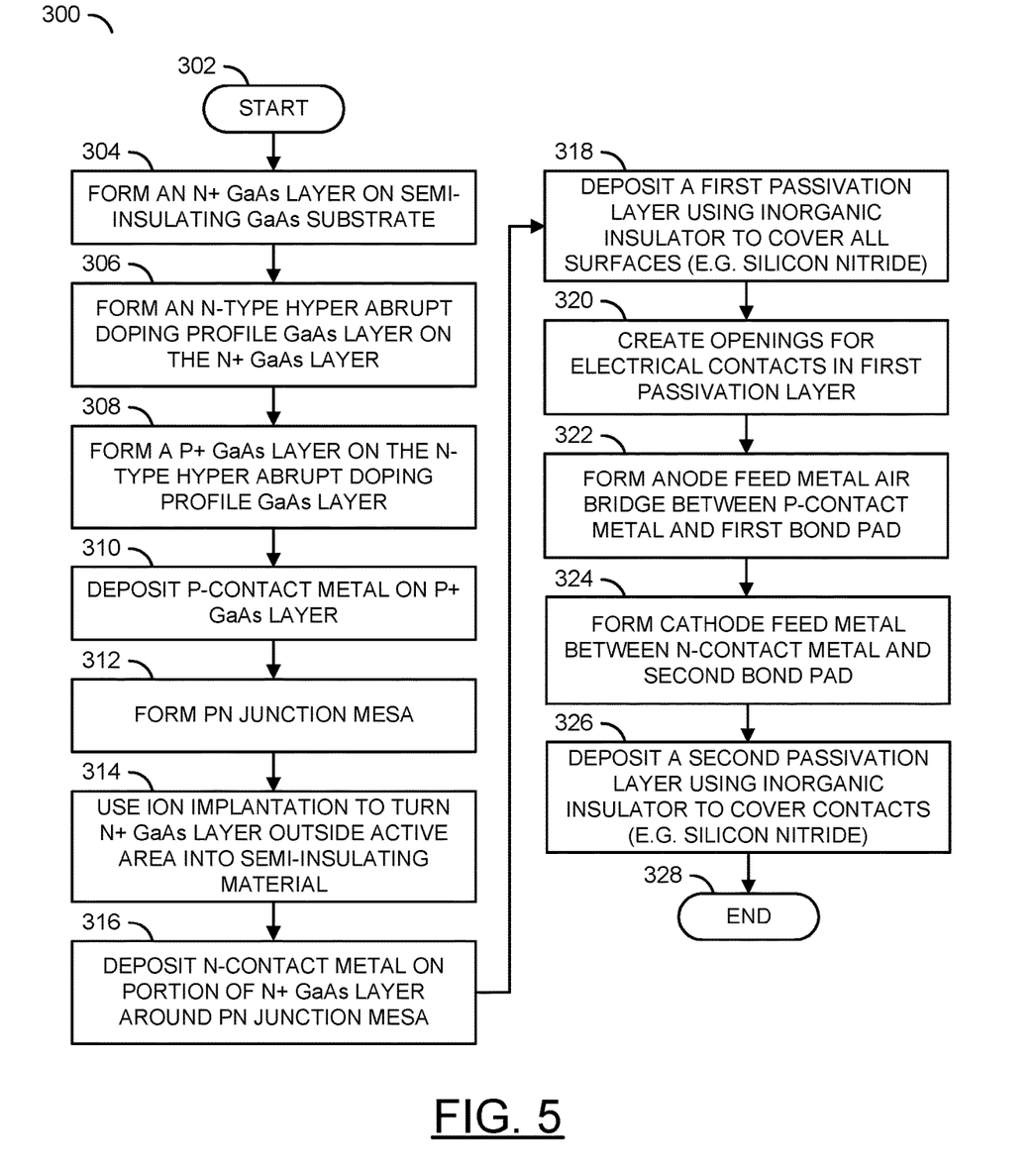
FIG. 5 is a flow diagram of a method for fabricating a semiconductor device in accordance with another example embodiment of the invention.

Referring to FIG. 5, a flow diagram of a process 300 is shown illustrating a method of fabricating a semiconductor device. In an example embodiment, the process (or method) 300 may comprise a step (or state) 302, a step (or state) 304, a step (or state) 306, a step (or state) 308, a step (or state) 310, a step (or state) 312, a step (or state) 314, a step (or state) 316, a step (or state) 318, a step (or state) 320, a step (or state) 322, a step (or state) 324, a step (or state) 326, and a step (or state) 328. The process 300 generally begins at the step 302 and moves to the step 304. In the step 304, the process 300 begins with the formation of a first layer of N+ GaAs on a semi-insulating GaAs substrate. The first layer may be formed by epitaxial growth or other suitable techniques. In the step 306, the process 300 may continue with formation of a second layer of N-type GaAs on the first layer of N+ GaAs. The second layer may be formed by epitaxial growth or other suitable techniques. The formation of the second layer may include creating a hyperabrupt doping profile within the second layer. In an example, the doping level may increase from a minimum value (e.g., $1 \times 10^{15}$ cm$^{-3}$) at the interface between the first layer and the second layer to a maximum level (e.g., 1×10$^{17}$ cm$^{-3}$) at an interface between the second layer and a third layer.

In the step 308, the process 300 may continue with the formation of the third layer of P+ GaAs on the second layer. The third layer may be formed by epitaxial growth or other suitable techniques. The thickness of the third layer may be substantially less than the thickness of the second layer. In an example embodiment, the first layer (e.g., N+ GaAs layer 112) may have a thickness range from about 500 nm to about 2000 nm, the second layer (e.g., n-type hyper abrupt doping profile layer 114) may have a thickness range from about 1000 nm to about 3000 nm, and the third layer (e.g., P+ GaAs layer 116) may have a thickness range from about 60 nm to about 200 nm. In the step 310, the process 300 may proceed with formation of a P-contact on the third layer of P+ GaAs. Formation of the P-contact on the third layer of P+ GaAs may include performing a metallization process to form the contact. In some embodiments, this may include forming one or more layers of metal by evaporation or other suitable techniques.

In the step 312, the process 300 may continue with the formation of a PN junction mesa. In the step 314, the process 300 may continue with the formation of a semi-insulating material around a portion of the first layer defining an active area of the semiconductor device. In an example, ion implantation may be used to turn the N+ GaAs material outside the active area into a semi-insulating isolation area. When the isolation area has been formed, the process 300 may move to the step 316. In the step 316, the process 300 may proceed with formation of an N-contact on a portion of the first layer of N+ GaAs surrounding the PN junction mesa. Formation of the N-contact on the first layer of N+ GaAs may include performing a metallization process to form the contact. In some embodiments, this may include forming one or more layers of metal by evaporation or other suitable techniques.

In the step 318, the process 300 continues by depositing a first passivation layer to cover all the surfaces of the semiconductor device. In an example, the first passivation layer may comprise an inorganic insulator (e.g., Silicon Nitride, etc.). In an example, the first passivation layer may comprise a thickness ranging from about 200 nm to about 500 nm. In the step 320, the process 300 continues by forming openings in the first passivation layer to expose the P-contact metal and the N-contact metal. In the step 322, the process 300 may continues with formation of an anode feed metal air bridge between the P-contact metal and a first bond pad. The air bridge helps to reduce parasitic capacitance. In some embodiments, the step 322 of the process 300 may include back filling a space under the anode feed metal air bridge with a low dielectric material, polyimide, or BCB. In the step 324, the process may continue with formation a cathode feed metal between the N-contact metal and a second bond pad. In an example, the anode feed metal and the cathode feed metal may comprise Gold with a thickness of about 3 μm. In some embodiments, the anode feed line metal and the cathode feed line metal may be formed in a single step.

When the anode feed line metal and the cathode feed line metal have been formed, the process 300 may move to the step 326. In the step 326, the process 300 may deposit a second passivation layer to cover all the contacts and feed line metal. In an example, the second passivation layer may comprise an inorganic insulator (e.g., Silicon Nitride, etc.), polyimide, or BCB. In an example, a thickness of the second passivation layer may vary from about 3 μm to about 5 μm.

In the step 328, the process 300 may be terminated with the semiconductor device in wafer form. At a later time, the process 300 may continue with wafer thinning and die singularization steps.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The functions and structures illustrated in the diagrams of FIGS. 1 to 5 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may be also be implemented in one or more of RF analog and/or digital ASICs (application specific integrated circuits) and/or MMICs (monolithic microwave integrated circuits), which includes but is not limited to, power amplifiers, voltage controlled oscillators, phase locked oscillators, phase shifters, frequency dividers, etc. Embodiments of the present invention may be utilized in connection with RF frontend modules in microwave communications systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A semiconductor device comprising:
    a semiconductor die including a plurality of semiconductor layers disposed on an insulating substrate;
    an N-doped region defining an active area of the semiconductor device;
    an N-contact metal disposed on a first portion of said N-doped region;
    a PN junction mesa disposed on a second portion of said N-doped region, wherein said PN junction mesa comprises a hyperabrupt N-doping layer disposed on said first portion of said N-doped region and a P-doped layer disposed on said hyperabrupt N-doping layer;

a P-contact metal disposed on said P-doped layer of said PN junction mesa;

a first passivation layer covering said semiconductor layers of said semiconductor device and having openings for said N-contact metal and said P-contact metal;

an anode feed metal connecting said P-contact metal to a first bond pad, wherein said anode feed metal forms an arch from said P-contact metal to said first bond pad and said arch defines a space between said anode feed metal and said first passivation layer covering said semiconductor layers and a side of said PN junction mesa;

a cathode feed metal connecting said N-contact metal to a second contact pad; and a second passivation layer covering said semiconductor device.

2. The semiconductor device according to claim 1, wherein said anode feed metal connection between said first bond pad and said P-contact metal comprises an air bridge.

3. The semiconductor device according to claim 1, wherein said space between said anode feed metal and said first passivation layer is filled with at least one of an inorganic low dielectric material, polyimide, and benzocyclobutene (BCB).

4. The semiconductor device according to claim 1, wherein said semiconductor device comprises a varactor diode.

5. The semiconductor device according to claim 4, wherein said varactor diode has a minimum varactor capacitance that is less than about 40 femtofarads (fF).

6. The semiconductor device according to claim 4, wherein said varactor diode has a maximum varactor capacitance ratio between zero voltage and high voltage that is greater than about 8:1.

7. The semiconductor device according to claim 4, wherein said PN junction mesa has a diameter less than about 20 µm.

8. The semiconductor device according to claim 4, wherein said PN junction mesa covers an area less than about 300 µm².

9. The semiconductor device according to claim 1, wherein said N-doped region, said N-contact metal, and said anode feed metal are configured to minimize an overlap area.

10. The semiconductor device according to claim 9, wherein said first portion of said N-doped region and said N-contact metal form a gap where said anode feed metal crosses over to connect to said P-contact metal.

11. The semiconductor device according to claim 1, wherein said N-doped region comprises a mesa on said insulating substrate and said PN junction mesa is formed on said N-doped region mesa.

12. The semiconductor device according to claim 1, wherein said N-doped region is embedded in an isolation layer disposed on said insulating substrate.

13. The semiconductor device according to claim 1, wherein said N-contact metal is configured as an annular ring around said PN junction mesa.

14. The semiconductor device according to claim 13, wherein said annular ring has a gap under said arch of said anode feed metal.

15. The semiconductor device according to claim 1, wherein said N-doped region comprises at least one of n+ gallium arsenide and gold germanium/nickel/gold alloy.

16. A method of implementing a semiconductor device on a semiconductor die including a plurality of semiconductor layers disposed on an insulating substrate, said method comprising:

depositing an N-doped semiconductor layer on said insulating substrate;

depositing an N-type hyper abrupt N-doping profile layer on said N-doped semiconductor layer;

depositing an P-doped layer on said N-type hyper abrupt N-doping profile layer;

depositing a P-contact metal on said P-doped layer;

forming a PN junction mesa by removing portions of said P-doped layer and said N-type hyper abrupt N-doping profile layer;

forming an active area of said semiconductor device using at least one of etching and ion implantation of said N-doped semiconductor layer;

depositing an N-contact metal on said N-doped semiconductor layer surrounding said PN junction mesa;

depositing a first passivation layer covering said semiconductor layers of said semiconductor device and having openings for access to said N-contact metal and said P-contact metal;

forming a cathode feed metal connecting said N-contact metal to a first contact pad and an anode feed metal bridge connecting said P-contact metal to a second bond pad, wherein said anode feed metal bridge forms an arch from said P-contact metal to said second bond pad and said arch defines a space between said anode feed metal bridge and said first passivation layer covering said semiconductor layers and a side of said PN junction mesa; and depositing a second passivation layer covering said semiconductor device.

17. The method according to claim 16, further comprising back-filling said space between said anode feed metal bridge and said first passivation layer with at least one of an inorganic low dielectric material, polyimide, and benzocyclobutene (BCB).

18. The method according to claim 16, wherein said ion implantation turns a portion of said N-doped semiconductor layer outside said active area into a semi-insulating material.

19. The method according to claim 16, wherein said etching removes a portion of said N-doped semiconductor layer outside said active area to form an isolation mesa.

20. The method according to claim 16, wherein said etching and said ion implantation are configured to form a gap in a portion of said active area beneath said anode feed metal bridge to minimize an overlap of said anode feed metal bridge with said N-doped semiconductor layer and said N-contact metal in said active area.

* * * * *